US006925184B2

(12) United States Patent
Wang

(10) Patent No.: US 6,925,184 B2
(45) Date of Patent: Aug. 2, 2005

(54) METHOD FOR CONVERTING TWO-CHANNEL AUDIO SYSTEM INTO MULTICHANNEL AUDIO SYSTEM AND AN AUDIO PROCESSOR THEREOF

(75) Inventor: Ko-Kang Wang, Hsin-Tien (TW)

(73) Assignee: Princeton Technology Corp., Hsin-Tien (TW)

( * ) Notice: Subject to any disclaimer, the term of this patent is extended or adjusted under 35 U.S.C. 154(b) by 431 days.

(21) Appl. No.: 10/157,924

(22) Filed: May 31, 2002

(65) Prior Publication Data

US 2003/0223589 A1 Dec. 4, 2003

(51) Int. Cl.[7] ............................ H04R 5/00; H03F 21/00

(52) U.S. Cl. ............................ 381/18; 381/1; 381/120; 381/27

(58) Field of Search ................................ 381/1, 18, 27, 381/123, 17, 307, 119, 61, 22

(56) References Cited

U.S. PATENT DOCUMENTS

| | | | | |
|---|---|---|---|---|
| 4,097,688 A | * | 6/1978 | Ochi | 381/18 |
| 4,479,235 A | * | 10/1984 | Griffis | 381/17 |
| 5,400,411 A | * | 3/1995 | Lee | 381/109 |
| 5,497,425 A | * | 3/1996 | Rapoport | 381/18 |
| 5,504,819 A | * | 4/1996 | Fosgate | 381/18 |

* cited by examiner

*Primary Examiner*—Xu Mei
*Assistant Examiner*—Laura A. Grier
(74) *Attorney, Agent, or Firm*—Bacon & Thomas, PLLC

(57) ABSTRACT

The present invention provides a method to convert the conventional two-channel uncoded audio system into multichannel system. There is no coding/decoding procedure in the invention, but just process the phases of the original two audio channels to provide different audio sources for surrounding distribution and achieve the best effect of reproducing the original audios. The present invention also provides an audio processor for implementing the method.

3 Claims, 2 Drawing Sheets

METHOD FOR CONVERTING TWO-CHANNEL AUDIO SYSTEM INTO MULTICHANNEL AUDIO SYSTEM AND AN AUDIO PROCESSOR THEREOF

FIELD OF THE INVENTION

The present invention relates to a method for converting a two-channel audio system into a multichannel audio system and to an audio processor thereof, and more particularly to a method of processing the phase of the original audio signal to achieve the object.

BACKGROUND OF THE INVENTION

Multichannel Dolby system and the like are very popular in current audio systems. Those systems emphasize that the original multichannel audios are first encoded into two-channel audios for transmitting, and then returned to the original multichannel audios by a specially designed decoder for playing.

However, if a system has audios of only two channels, using the aforementioned multichannel systems for processing will cause misleading operation and distortion.

Therefore, if a system is to convert a two-channel audio system into a multichannel audio system, a special design is required.

OBJECT OF THE INVENTION

It is therefore an object of the present invention to provide a method to convert a two-channel audio system into multichannel audio system and an audio processor thereof. The original two-channel audios are not coded and decoded, but just the phase of the original audio signals is processed to achieve the object.

DETAILED DESCRIPTION OF THE INVENTION

Figure 1:
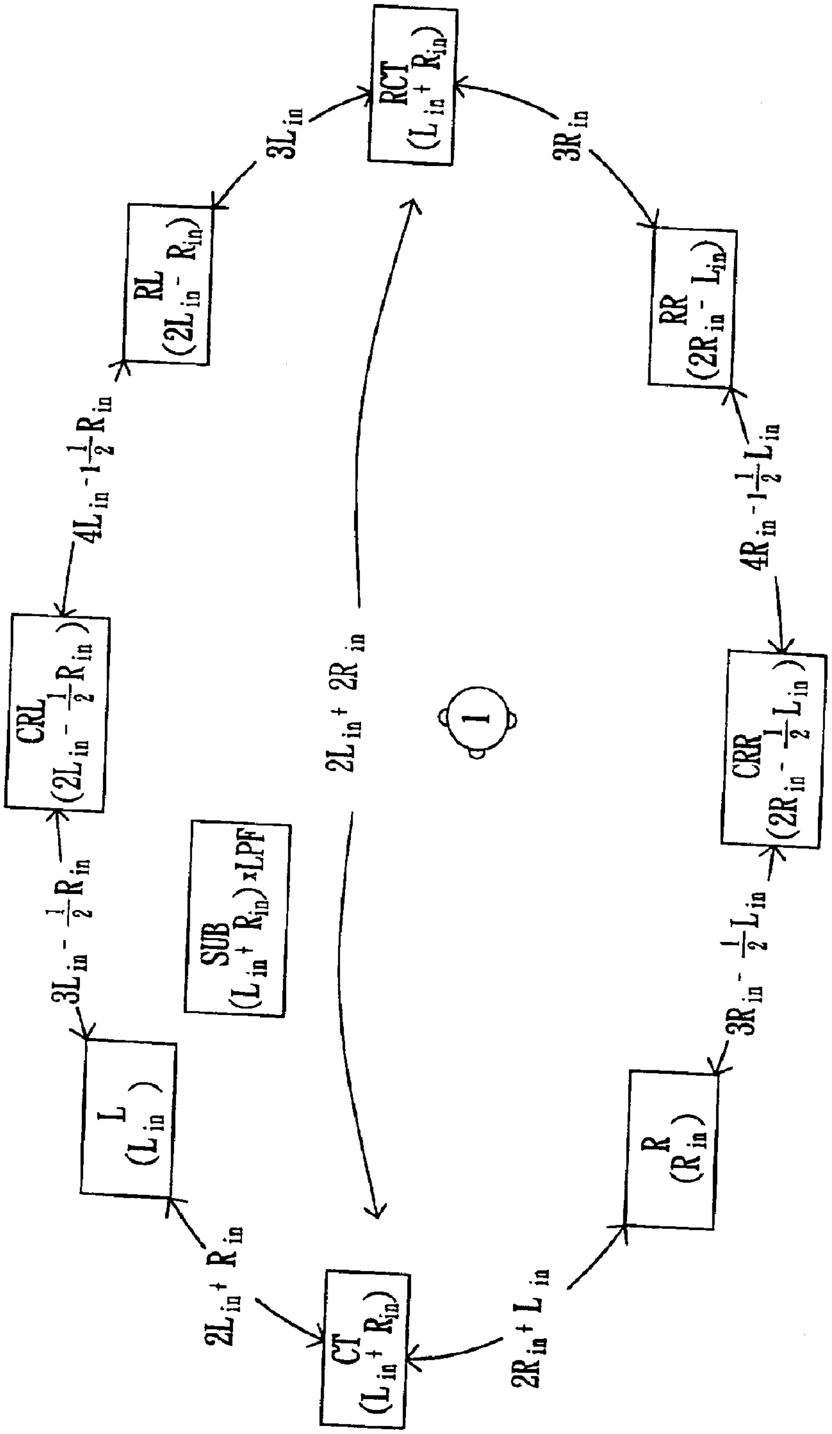
FIG. 1 shows schematically the surrounding distribution of converting a two-channel audio system into multichannel audio system according to the present invention.

Referring to FIG. 1, which shows schematically the surrounding distribution of converting a two-channel audio system into multichannel audio system according to the present invention. An audience 1 is in the center, 9 audio equipments are distributed surroundingly as CT, L, CRL, RL, RCT, RR, CRR, R and SUB respectively.

The conventional two-channel audios $L_{in}$ (left channel audio) and $R_{in}$ (right channel audio) are inputted into each of the 9 audio equipments, and are processed by a specially designed audio processor 2 (see FIG. 2) for outputting special outputs.

The special outputs of the 9 audio equipments are as below:

1. CT: $L_{in}+R_{in}$
2. L: $L_{in}$
3. CRL: $2L_{in}-(½)R_{in}$
4. RL: $2L_{in}-R_{in}$
5. RCT: $L_{in}+R_{in}$
6. RR: $2R_{in}-L_{in}$
7. CRR: $2R_{in}-(½)L_{in}$
8. R: $R_{in}$
9. SUB: $(L_{in}+R_{in})\times$LPF $L_{in}$ represents left channel audio, while $R_{in}$ represents right channel audio, and LPF is a low-pass filter. The audio effects in the spaces between each two of the 9 audio equipments are $2L_{in}+R_{in}$, $3L_{in}-(½)R_{in}$, $4L_{in}-(1+½)R_{in}$, $3L_{in}$, $3R_{in}$, $4R_{in}-(1+½)L_{in}$, $3R_{in}-(½)L_{in}$, $2R_{in}+L_{in}$ and $2L_{in}+2R_{in}$ respectively as shown.

Figure 2:
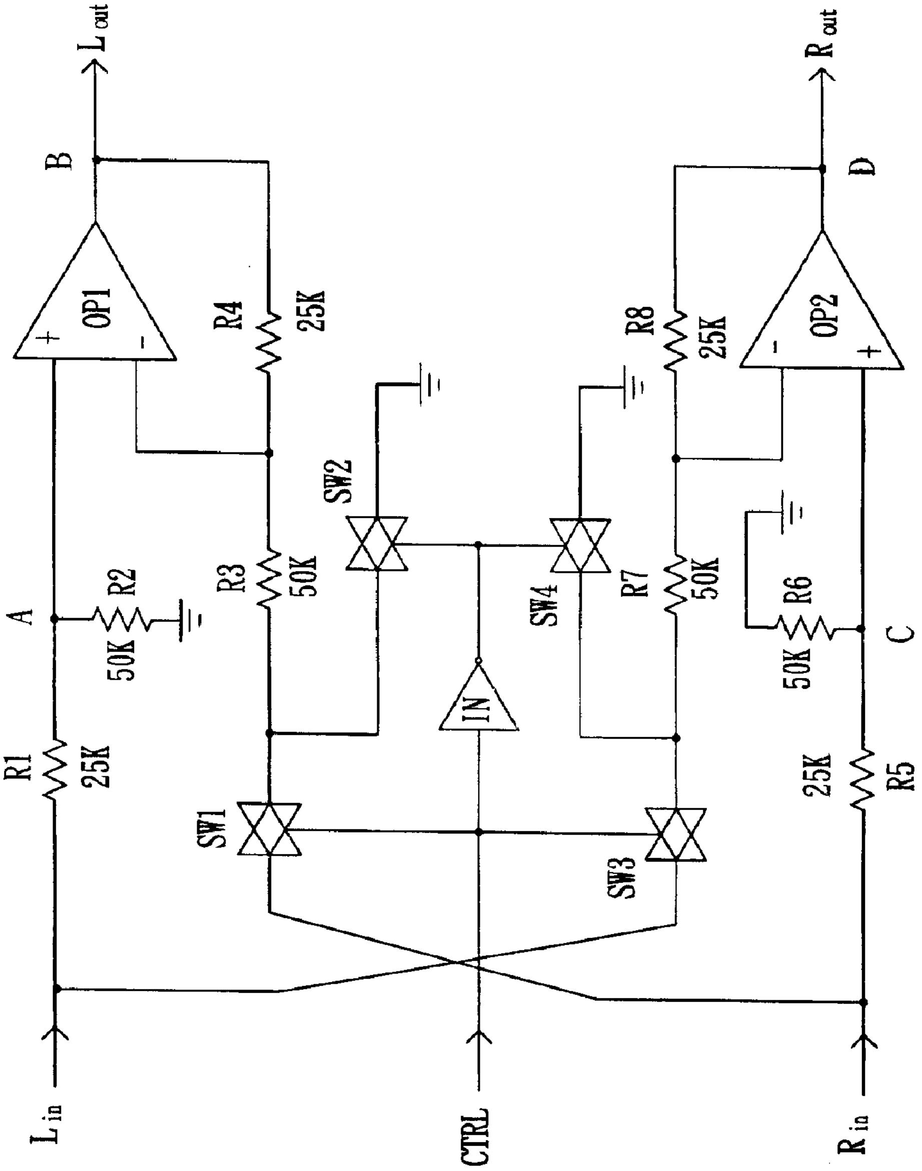
FIG. 2 shows schematically a circuit diagram of the audio processor according to the present invention.

Referring to FIG. 2, which shows schematically a circuit diagram of the audio processor according to the present invention, in which the left channel audio $L_{in}$ and the right channel audio $R_{in}$ are inputted respectively into operational amplifiers OP1 and OP2 through some resistors. A control signal CTRL in the center of the circuit diagram is used to control four switches SW1, SW2, SW3 and SW4. An inverter IN is also included as shown.

When the control signal CTRL is low, SW1 will open and SW2 will close, the right channel audio $R_{in}$ can't be inputted into OP1, so OP1 is only influenced by the left channel audio $L_{in}$. According to the principle of the operational amplifier, the voltage level of $L_{out}$ at B must be the voltage level at A×(R3+R4)/R3, while the voltage level at A is $L_{in}$×R2/(R1+R2) according to the circuit diagram, thus $L_{out}=L_{in}$×R2/(R1+R2)×(R3+R4)/R3=$L_{in}$ ○

When the control signal CTRL is high, SW1 will close and SW2 will open, the right channel audio $R_{in}$ will be inputted into the "–" terminal of OP1 through resistor R3. According to the principle of the operational amplifier, the right channel audio $R_{in}$ will generate an output of $R_{in}$×(–)R4/R3=$-½R_{in}$ at B, while the left channel audio $L_{in}$ will generate an output of $L_{in}$ at B (as described above), thus the composition voltage of $L_{out}$ at B is $L_{in}-½R_{in}$ ○

In the circuit of the audio processor stated above, since it is designed by letting R1=R4 and R2=R3, the left channel audio $L_{in}$ can be reproduced at $L_{out}$. If we need to demonstrate the influence of the right channel audio $R_{in}$, it is only necessary to change the voltage level of the control signal CTRL, and the user can clearly distinguish the effect of adding the right channel audio $R_{in}$ ○

In the circuit of the audio processor stated above, $L_{out}=L_{in}$, but if we change the ratio between R1 and R2, the coefficient before $L_{in}$ in $L_{out}$ can be changed; and if we change the ratio between R3 and R4, the coefficient before $R_{in}$ in $L_{out}$ can be changed.

Similarly, when the control signal CTRL is low, SW3 will open and SW4 will close, the left channel audio $L_{in}$ can't be inputted into OP2, so OP2 is only influenced by the right channel audio $R_{in}$. According to the principle of the operational amplifier, the voltage level of $R_{out}$ at D must be the voltage level at C×(R7+R8)/R7, while the voltage level at C is $R_{in}$×R6/(R5+R6) according to the circuit diagram, thus $R_{out}=R_{in}$×R6/(R5+R6)×(R7+R8)/R7=$R_{in}$.

When the control signal CTRL is high, SW3 will close and SW4 will open, the left channel audio $L_{in}$ will be inputted into the "–" terminal of OP2 through resistor R7. According to the principle of the operational amplifier, the left channel audio $L_{in}$ will generate an output of $L_{in}$×(–)R8/R7=$-½L_{in}$ at D, while the right channel audio $R_{in}$ will generate an output of $R_{in}$ at D (as described above), thus the composition voltage of $R_{out}$ at D is $R_{in}-½L_{in}$.

In the circuit of the audio processor stated above, since it is designed by letting R5=R8 and R6=R7, the right channel audio $R_{in}$ can be reproduced at $R_{out}$. If we need to demonstrate the influence of the left channel audio $L_{in}$, it is only necessary to change the voltage level of the control signal CTRL, and the user can clearly distinguish the effect of adding the left channel audio $L_{in}$.

In the circuit of the audio processor stated above, $R_{out}=R_{in}$, but if we change the ratio between R5 and R6, the coefficient before $R_{in}$ in $R_{out}$ can be changed, and if we change the ratio between R7 and R8, the coefficient before $L_{in}$ in $R_{out}$ can be changed.

Referring to FIG. 1 again, it is found that each of the outputs of the 9 audio processors has different coefficients before $L_{in}$ and $R_{in}$, this is because we change the ratio between related resistors.

The operational amplifiers, the voltage dividers, the switches, the resistors and the inverter in the audio processor of the present invention can be implemented by the digital simulation techniques of computer software.

The spirit and scope of the present invention depends only upon the following Claims, and is not limited by the above embodiment.

What is claimed is:

1. An audio processor for converting a two-channel audio system into a multichannel audio system, comprising an operational amplifier, wherein:

one channel of the two-channel audio system is inputted into a "+" terminal of the operational amplifier through a voltage divider, another channel of the two-channel audio system is inputted into a "−" terminal of the operational amplifier through a switch and a resistor R3, an output of the operational amplifier is fed back to the "−" terminal of the operational amplifier through a resistor R4, said switch is used to control the inputting of said another channel, and said voltage divider comprises a resistor R1 and a resistor R2, one channel of the two-channel audio system is input into said voltage divider, a connecting point between said resistor R1 and said resistor R2 acts as an output of said voltage divider, the resistors having a relation R1=R4 and R2=R3 to ensure that the audio input into said "+" terminal of the operational amplifier is not influenced by said switch.

2. An audio processor for converting a two-channel audio system into a multichannel audio system, wherein:

one channel of the two-channel audio system is inputted into a "+" terminal of the operational amplifier through a voltage divider, another channel of the two-channel audio system is inputted into a "−" terminal of the operational amplifier through a switch and a resistor R3, an output of the operational amplifier is fed back to the "−" terminal of the operational amplifier through a resistor R4, said voltage divider comprises a resistor R1 and a resistor R2, one channel of the two-channel audio system is input into said voltage divider, a connecting point between said resistor R1 and said resistor R2 acts as an output of said voltage divider, the resistors having a relation R1=R4 and R2=R3, to ensure that the audio input into said "+" terminal of the operation amplifier is not influence by said switch, and said switch is used to control the inputting of said another channel, said switch comprises two switches, one switch SW1 is controlled by a control signal, another switch SW2 is controlled by said control signal through an inverter, said another channel is input into said switch SW1, then input into said resistor R3, and said another switch SW2 is connected from a connecting point between said switch SW1 and said resistor R3 and to ground.

3. An audio processor for converting a two-channel audio system into a multichannel audio system, wherein:

one channel of the two-channel audio system is inputted into a "+" terminal of the operational amplifier through a voltage divider, another channel of the two-channel audio system is inputted into a "−" terminal of the operational amplifier through a switch and a resistor R3, an output of the operational amplifier is fed back to the "−" terminal of the operational amplifier through a resistor R4, said voltage divider comprises a resistor R1 and a resistor R2, one channel of the two-channel audio system is input into said voltage divider, a connecting point between said resistor R1 and said resistor R2 acts as an output of said voltage divider, the resistors having a relation R1=R4 and R2=R3, to ensure that the audio input into said "+" terminal of the operation amplifier is not influence by said switch, and said switch is used to control the inputting of said another channel, a ratio between the resistor R1 and the resistor R2, a ratio between the resistor R3 and the resistor R4, or both the ratio between the resistor R1 and the resistor R2 and the ratio between the resistor R3 and the resistor R4 are arranged to be changed to achieve various combinations to form a multichannel audio system.

* * * * *